(12) United States Patent
Street et al.

(10) Patent No.: US 7,476,955 B2
(45) Date of Patent: Jan. 13, 2009

(54) DIE PACKAGE HAVING AN ADHESIVE FLOW RESTRICTION AREA

(75) Inventors: Bret K. Street, Meridian, ID (US); James M. Derderian, Boise, ID (US); Jeremy E. Minnich, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/751,441

(22) Filed: Jan. 6, 2004

(65) Prior Publication Data

US 2005/0151272 A1 Jul. 14, 2005

(51) Int. Cl.
*H01L 29/72* (2006.01)
(52) U.S. Cl. .................. 257/434; 257/622; 257/680; 257/687; 257/710; 257/783; 257/787
(58) Field of Classification Search .............. 257/678, 257/704, 783, 434, 431, 432, 622, 680, 687, 257/710, 787
See application file for complete search history.

(56) References Cited

U.S. PATENT DOCUMENTS

| 6,225,695 | B1 * | 5/2001 | Chia et al. | 257/712 |
| 6,509,636 | B1 * | 1/2003 | Tsai et al. | 257/678 |
| 6,566,745 | B1 * | 5/2003 | Beyne et al. | 257/680 |
| 6,744,109 | B2 * | 6/2004 | Barton et al. | 257/436 |
| 7,067,358 | B2 * | 6/2006 | Chen-Tung et al. | 438/127 |
| 2001/0014486 | A1 * | 8/2001 | Glenn | 438/64 |

* cited by examiner

*Primary Examiner*—Edward Wojciechowicz
(74) *Attorney, Agent, or Firm*—Dickstein Shapiro LLP

(57) ABSTRACT

A die package having an adhesive flow restriction area. In a first embodiment, the adhesive flow restriction area is formed as a trench in a transparent element. A second embodiment has a transparent element with an adhesive flow restriction area formed as a plurality of trenches that extend from one edge of the transparent element to the other edge. A third embodiment has a transparent element with an adhesive flow restriction area formed as a plurality of trenches. A fourth embodiment has a transparent element with an adhesive flow restriction area formed as a protuberance. A fifth embodiment comprises a trench in the die. A sixth embodiment has a die with a plurality of trenches in the die as an adhesive flow restriction area. A seventh embodiment has a die with a protuberance.

14 Claims, 16 Drawing Sheets

DIE PACKAGE HAVING AN ADHESIVE FLOW RESTRICTION AREA

FIELD OF THE INVENTION

The present invention relates to a die package; specifically, a die package having an adhesive flow restriction area.

BACKGROUND OF THE INVENTION

Integrated circuits, including dies, for example, imager dies such as charge-coupled-devices (CCD) and complementary metal oxide semiconductor (CMOS) dies, have commonly been used in photo-imaging applications. Such dies typically contain thousands of pixel cells in a pixel array on a single chip. Pixel cells convert light into an electrical signal that can then be stored and recalled by an electrical device such as, for example, a processor.

Dies are typically packaged and inserted into imaging devices such as, for example, a digital camera. FIG. 1 illustrates a cross-sectional view of one conventional die package 100. The die package 100 includes a die 14 positioned on a substrate 10. The die 14 includes an array of pixels 16. The die 14 typically has a transparent element 18 attached to a surface containing the array of pixels 16 by an adhesive material 24.

In operation, light radiation enters the transparent element 18 of the die package 100. The transparent element 18 filters out IR radiation that can cause color shifts due to cross talk between pixels in the array of pixels 16. Light radiation is then adsorbed, and image signals are created by the array of pixels 16, which converts the photons from light radiation to electrical signals. Wire bonds 13 conduct electrical output signals from the die 14 to wiring on the substrate 10, which, in turn, connects to external circuitry (not shown). The external circuitry may include processing circuits for storing, compressing, manipulating, or displaying an acquired image.

The FIG. 1 die package 100 is formed by placing the die 14 on the substrate 10, applying adhesive material 24 on the periphery of the die 14, and finally placing the transparent element 18 over the die 14. The adhesive material 24 ensures that the transparent element 18 remains attached to the die 14.

While the package illustrated in FIG. 1 works well, the adhesive material 24 often interferes with the array of pixels 16. During the process of attaching the transparent element 18 to the die 14, adhesive material 24 often covers the edge pixels of the array of pixels 16, as illustrated in FIG. 1. As the transparent element 18 is placed over the die 14, capillary action, as well as the force pushing down on the adhesive material 24, may force the adhesive material 24 onto the array of pixels 16, thus interfering with the operation of the die 14. This can lower the yield of packaged products and may affect the performance of packaged products which pass yield tests.

The problem may also be present in packaged dies fabricated to have display pixels, rather than pixels used to receive an image and convert it to electrical signals, resulting in poor visual quality.

BRIEF SUMMARY OF THE INVENTION

The present invention, in its various exemplary embodiments, provides a die package having an adhesive flow restriction area. In a first embodiment, the adhesive flow restriction area is formed as a trench in a transparent element. In a second embodiment the adhesive flow restriction area is comprised of a plurality of concentric trenches. In a third embodiment the adhesive flow restriction area is comprised of a plurality of trenches that extend from edge to edge of the transparent element. A fourth embodiment illustrates the adhesive flow restriction area comprised of a protuberance on a surface of the transparent element. In a fifth embodiment, the adhesive flow restriction area is comprised of a trench in a die. A sixth embodiment has a die with a plurality of concentric trenches comprising an adhesive flow restriction area. In a seventh embodiment, the adhesive flow restriction area is comprised of a protuberance on a die.

BRIEF DESCRIPTION OF THE DRAWINGS

The above-described features of the invention will be more clearly understood from the following detailed description, which is provided with reference to the accompanying drawings in which.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "transparent element" or "transparent plate" refer to any material through which light radiation can pass, reflect, or refract. Materials that could form a transparent element include, but are not limited to, glass, for example, zinc selenide (ZnSe), boro-phospho-silicate glass (BPSG), phosphosilicate glass (PSG), borosilicate glass (BSG), silicon oxide, silicon nitride, or silicon oxynitride; an optical thermoplastic material such as tantalum pentoxide ($Ta_2O_5$), titanium oxide ($TiO_2$), polymethylmethacrylate, polycarbonate, polyolefin, cellulose acetate butyrate, or polystyrene; a polyimide; a thermoset resin such as an epoxy resin; a photosensitive gelatin; or a radiation curable resin such as acrylate, methacrylate, urethane acrylate, epoxy acrylate, or polyester acrylate. The preceding materials are only illustrative examples.

The term "adhesive flow restriction area" refers to any structural feature, provided on one or both of a transparent element and a die, which impedes the flow of an adhesive. Exemplary embodiments of the invention illustrate the adhesive flow restriction area as one or more trenches or protuberances provided on at least one of the transparent element and die. The adhesive flow restriction area may be capable of breaking the wicking action of an aqueous solution into a small tube-like structure, or channel. The adhesive flow restriction area may be a separate channel which uses capillary action itself, and diverts aqueous solutions from one area to another. The adhesive flow restriction area may also include a raised structure, or protuberance, that prevents the aqueous solution from entering a channel that the solution may otherwise enter.

Figure 1:
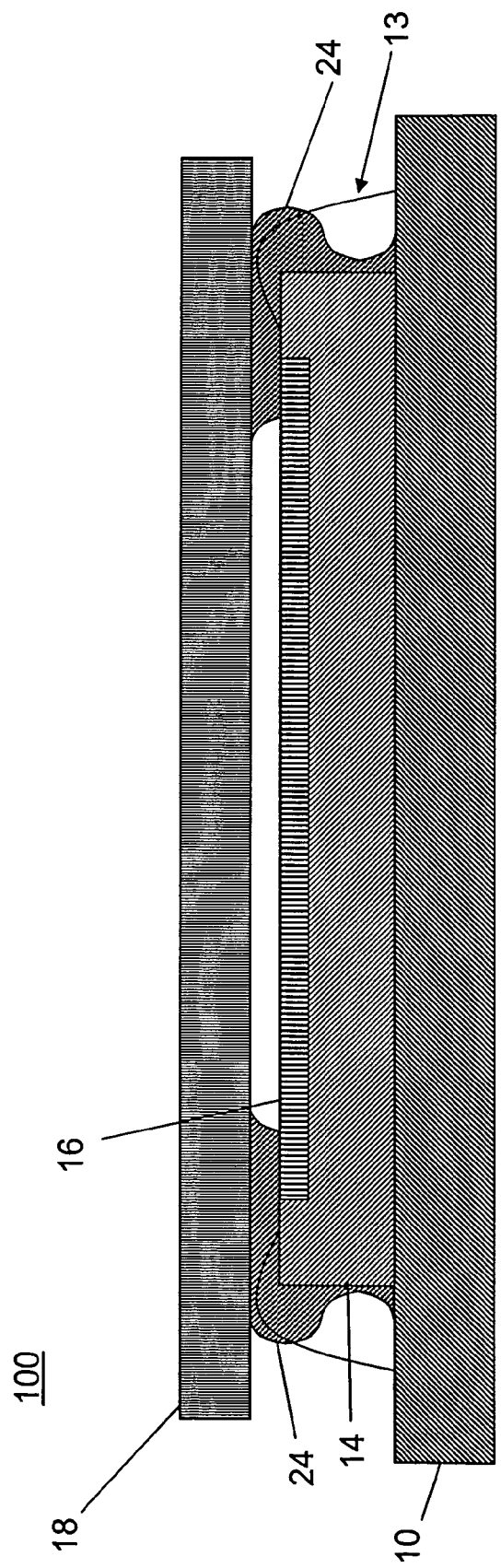
FIG. 1 illustrates a cross-sectional view of a conventional die package.
Figure 2:
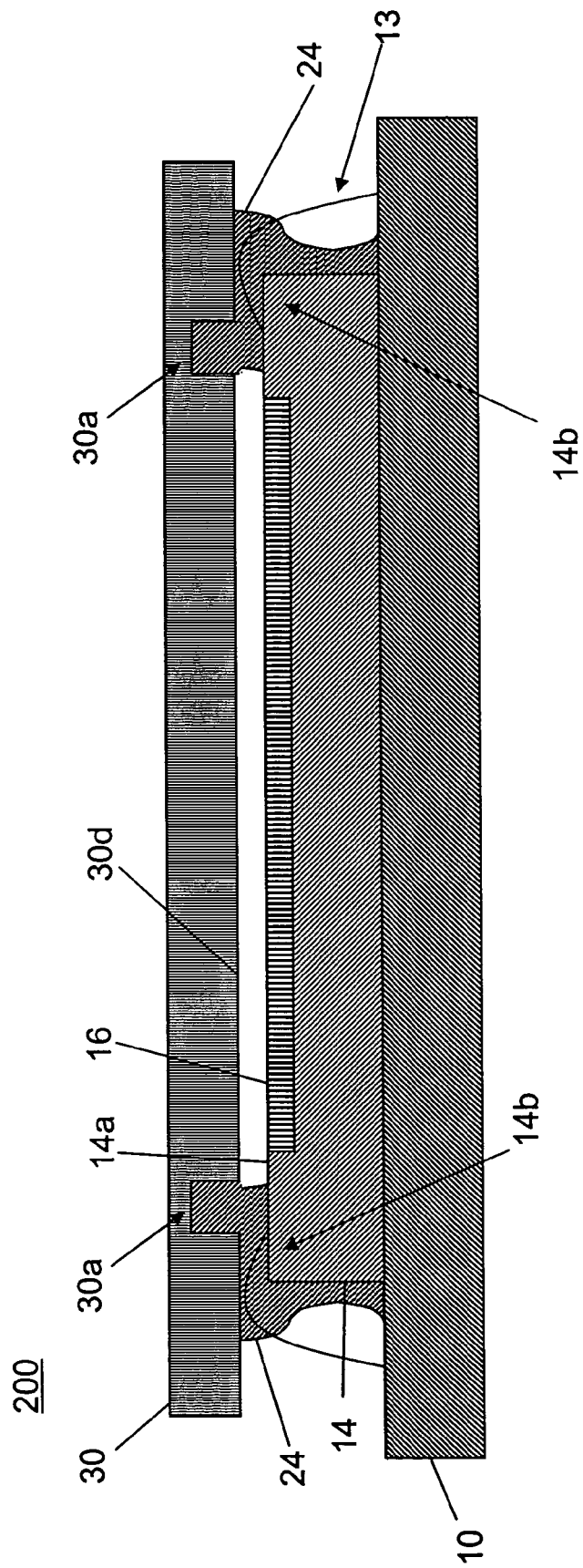
FIG. 2 illustrates a cross-sectional view of a die package constructed in accordance with a first exemplary embodiment of the invention.

Referring now to the figures, where like reference numbers designate like elements, FIG. 2 illustrates an exemplary die package 200 constructed in accordance with a first embodiment of the invention. Specifically, the FIG. 2 die package 200 includes a die 14 containing an array of pixels 16 electrically connected to a substrate 10 by wire bonds 13. The die package 200 includes an adhesive flow restriction area 30a formed in a lower surface 30d of a transparent element 30, which faces the die 14. The transparent element 30 is attached to the die 14 by an adhesive material 24.

As illustrated, the adhesive flow restriction area 30a in the transparent element 30 is a trench, or channel, designed to fill with any excess adhesive material 24 that has been placed on a periphery 14b of the die 14 that might otherwise move onto and interfere with the array of pixels 16 on the die 14 or the wire bonding 13. The adhesive flow restriction area 30a also interferes with any capillary action which might otherwise occur between the lower surface 30d of the transparent element 30 and an upper surface 14a of the die 14. Because the adhesive flow restriction area 30a hinders the adhesive material 24 from wicking onto and covering pixels of the array of pixels 16 on the die 14, by capillary action, the packaged structure may have improved image quality and a higher yield.

The illustrated configuration may also provide more stability to the overall die package 200. In this regard, the adhesive material 24 located within the adhesive flow restriction area 30a trench acts as posts to stabilize the transparent lens 30 in the die package 200. Because the surface of the adhesive material 24 is not flat, the transparent lens 30 is less prone to sliding off the adhesive material 24 during processing.

Figure 3:
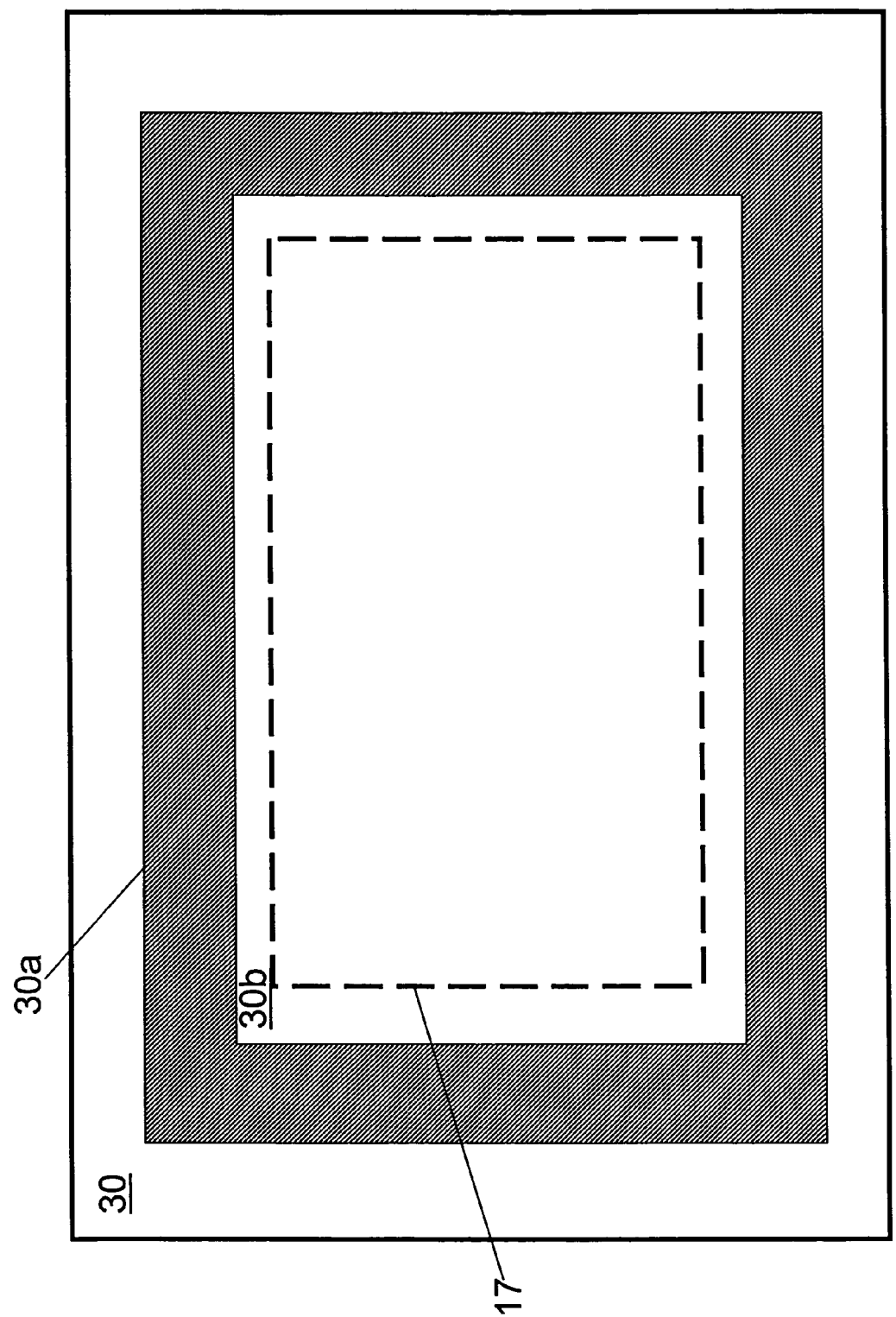
FIG. 3 illustrates a top-down view of a surface of the FIG. 2 transparent element constructed in accordance with the first exemplary embodiment of the invention.

FIG. 3 illustrates a top-down view of a side of the FIG. 2 transparent element 30 having the adhesive flow restriction area 30a. The illustrated adhesive flow restriction area 30a at least partially defines a predefined area 30b of the transparent element 30. The predefined area 30b corresponds to the array of pixels 16 (FIG. 2) on the die 14 (FIG. 2), or an array area 17 (illustrated as dotted lines). Typically, the predefined area 30b is larger than the array area 17. As described above with respect to FIG. 2, the adhesive flow restriction area 30b hinders the movement of the adhesive material 24 (FIG. 2) onto pixels in the array of pixels 16 (FIG. 2).

Although FIG. 3 illustrates an adhesive flow restriction area 30a as a trench around an entire periphery of an array of pixels 16, it should be noted that the adhesive flow restriction area 30a only needs to be provided where an adhesive material 24 (FIG. 2) is used to connect the transparent element 30 to the die 14 (FIG. 2). Accordingly, a continuous peripheral trench 30a may not always be needed.

Figure 4:
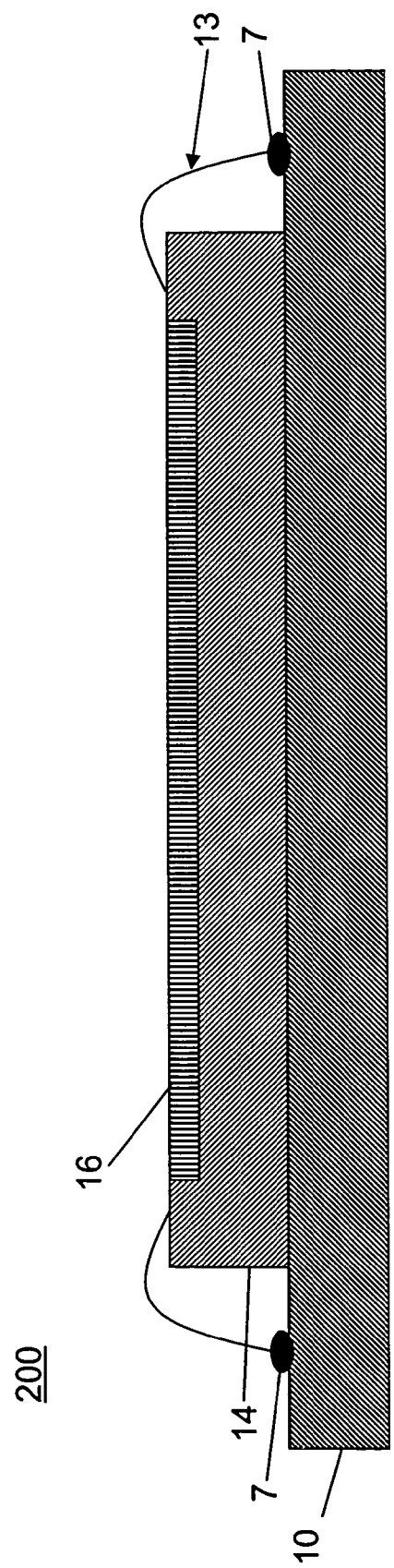
FIGS. 4-9 illustrate cross-sectional views of stages in fabrication of the FIG. 2 die package in accordance with the first exemplary embodiment of the invention.

FIGS. 4-9 illustrate stages of an exemplary embodiment of a method of forming the FIG. 2 die package 200. As illustrated in FIG. 4, a die 14 having an array of pixels 16 is positioned over a substrate 10. The die 14 is electrically connected to conductive lines 7 on the substrate 10 by wire bonds 13. The conductive lines 7 conduct electrical signals from the die 14 to external circuitry (not shown). For clarity's sake, the conductive lines 7 will be omitted from subsequent figures.

Figure 5:
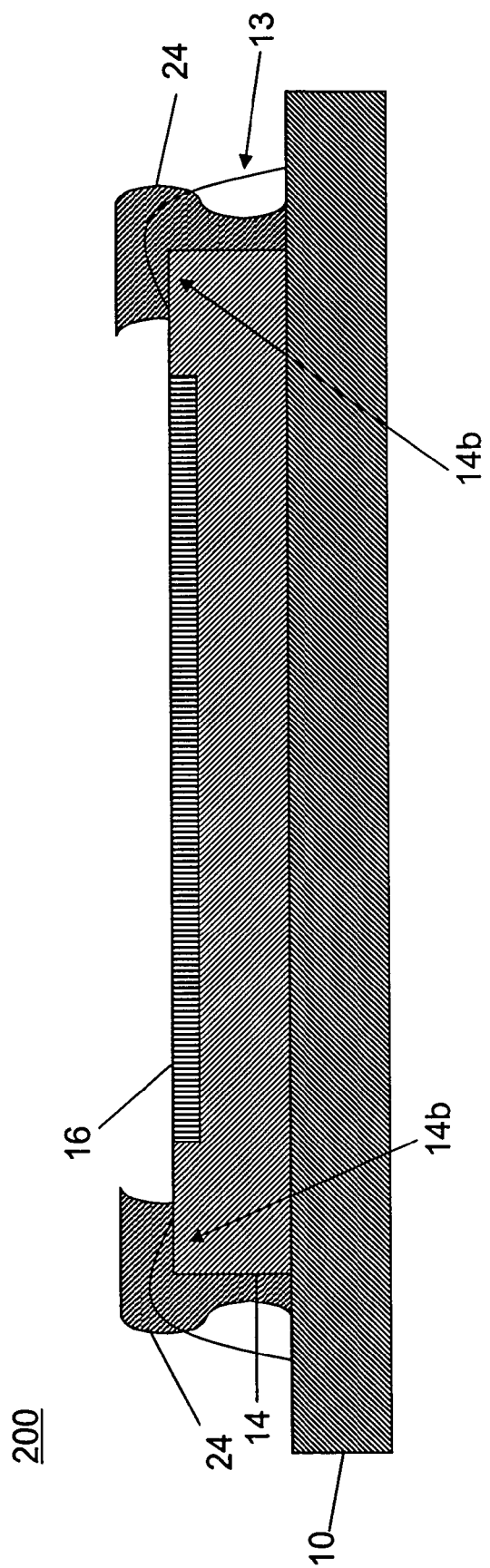
Figure 6:
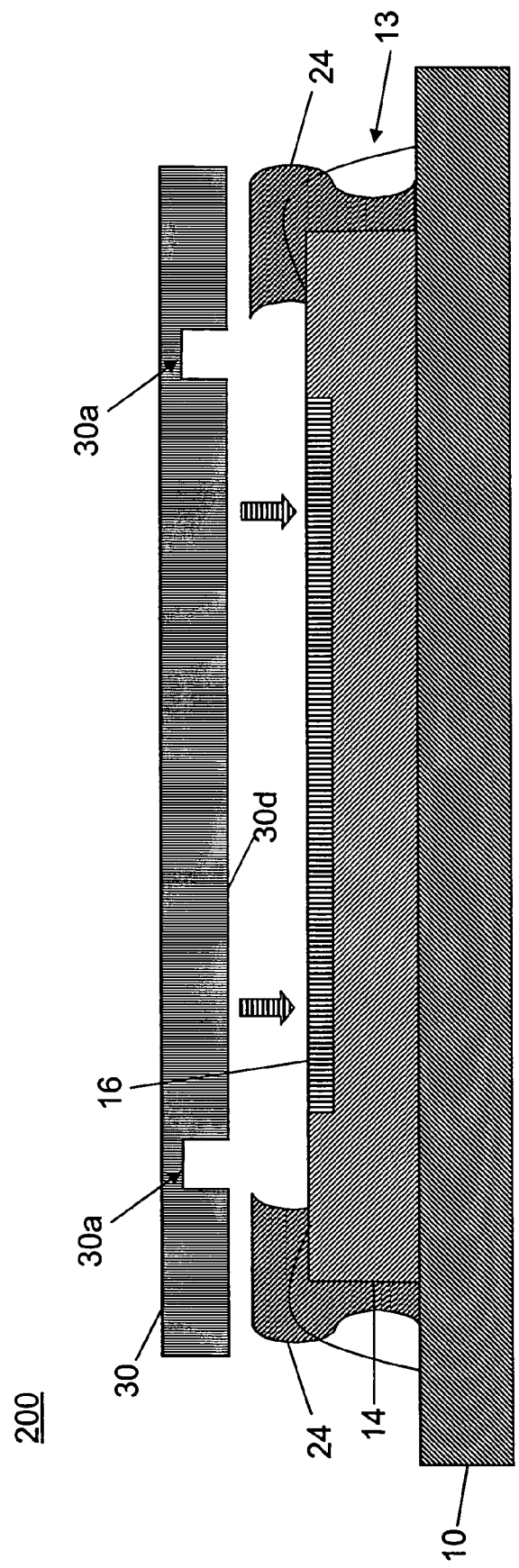

FIG. 5 illustrates adhesive material 24 deposited on the periphery 14b of the die 14, outside of the periphery of the array of pixels 16. FIG. 6 illustrates the transparent element 30 over the die. The transparent element 30 is placed over the die such that a surface 30d having an adhesive flow restriction area 30a is facing the die 14, as depicted by the patterned arrows. The trench forming the adhesive flow restriction area 30a could be formed by any method known in the art. For example, the adhesive flow restriction area 30a could be formed by chemical etching, reactive ion etching (RIE), sawing, or other means of creating an adhesive flow restriction area in the transparent element 30.

Figure 7:
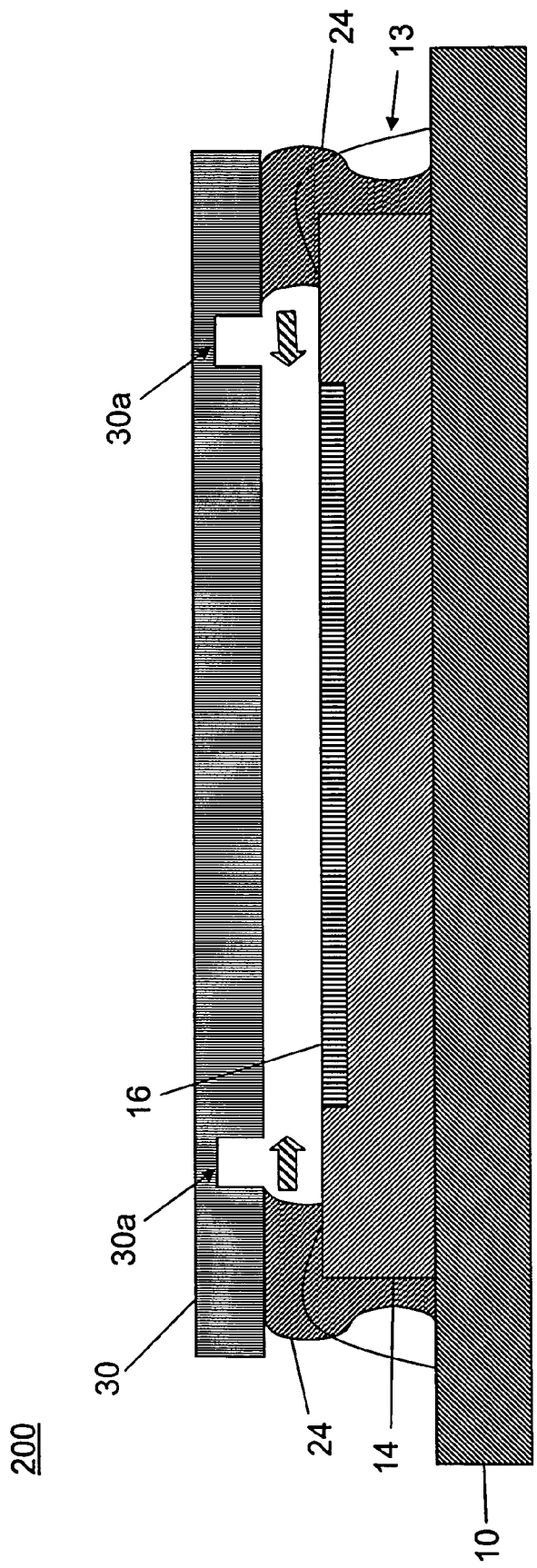
Figure 8:
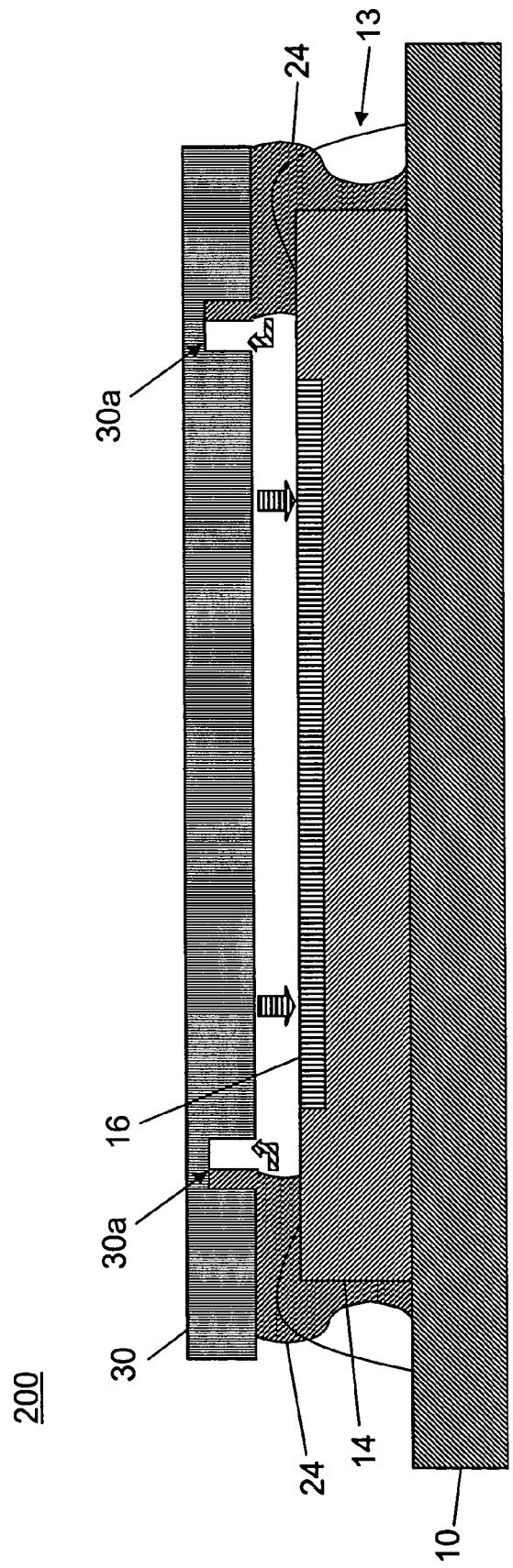

FIG. 7 illustrates the movement of the adhesive material 24. As the transparent element 30 is positioned over and attached to the die 14, downward pressure, and capillary action, causes the adhesive material 24 to move towards the array of pixels 16, as illustrated by the patterned arrows. As the transparent element 30 is further pressed onto the die 14, as illustrated in FIG. 8, the adhesive material 24 moves further towards the array of pixels 16, and the adhesive material 24 now moves into the trench of the adhesive flow restriction area 30a rather than over the array of pixels 16, due in part to capillary action. The movement is further illustrated by the patterned arrows.

Figure 9:
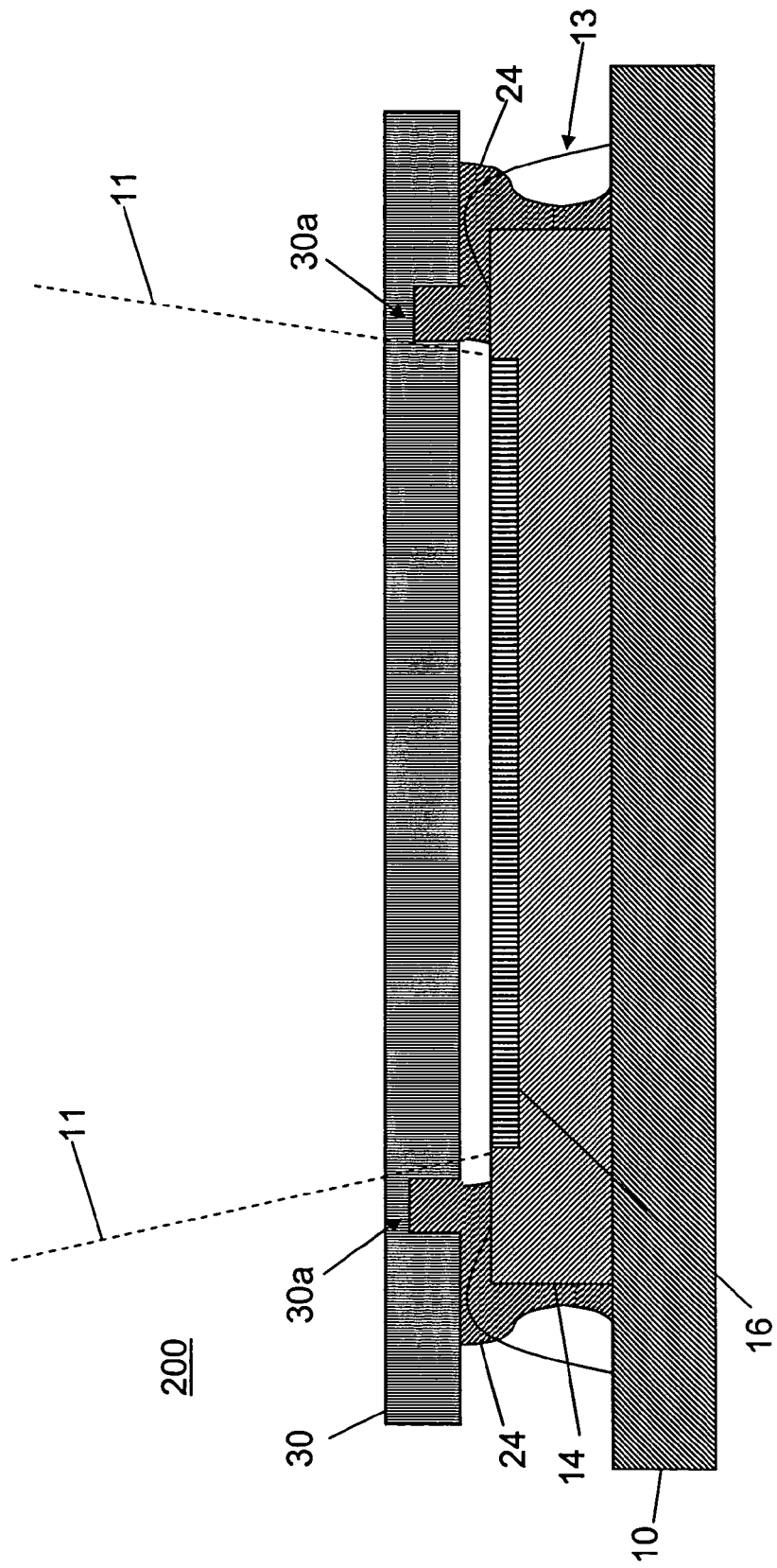

FIG. 9 illustrates the completed die package 200 including a transparent lens 30 attached to a die 14 by an adhesive material 24. The adhesive material 24, however, does not occlude an optical light path 11 (illustrated as dotted lines) to the array of pixels 16 due to the adhesive flow restriction area 30a preventing the movement of the adhesive material 24 onto the array of pixels 16.

Although the process has been described with reference to first placing the adhesive material 24 (e.g., FIG. 4) onto the die 14 (e.g., FIG. 4), the adhesive material 24 could also first be placed on the transparent element 30 (e.g., FIG. 5) before it is attached to the die 14 (e.g., FIG. 5). The adhesive flow restriction area 30a (e.g., FIG. 8) may prevent the adhesive material 24 (e.g., FIG. 8) from moving onto the array of pixels 16 (e.g., FIG. 9). Additionally, the adhesive material 24 could hermetically seal a vacant space between the array of pixels 16 (e.g., FIG. 9) and the transparent element (e.g., FIG. 9); or the adhesive material 24 can be applied over only a portion of the periphery 14b of the die 14 (e.g., FIG. 9) rather than to completely surround the array of pixels 16.

Figure 10:
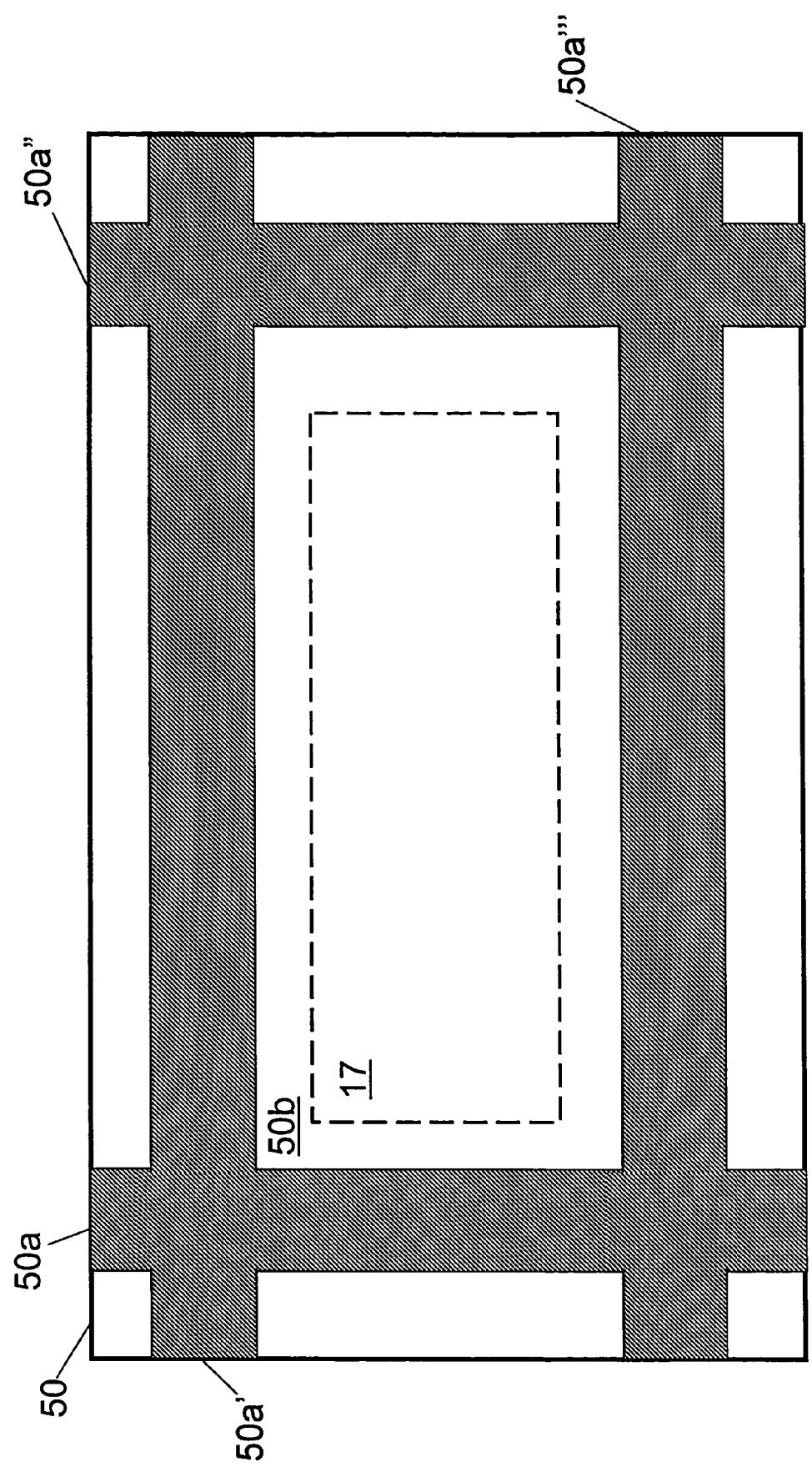
FIG. 10 illustrates a top-down view of a surface of a transparent element constructed in accordance with a second exemplary embodiment of the invention.

FIG. 10 illustrates a transparent element 50 in accordance with a second embodiment of the invention. The adhesive flow restriction area is comprised of a plurality of trenches 50a, 50a', 50a", 50a''' to at least partially define a predefined area 50b corresponding to an array area 17. The plurality of trenches 50a, 50a', 50a", 50a'" extend from edge to edge of the transparent element 50. As described above with respect to FIGS. 7 and 8, adhesive material 24 may enter the trenches 50a, 50a', 50a", 50a"' rather than entering the array area 17 and occluding the light path to at least some of the pixels of the array of pixels 16. Additionally, because the trenches 50a, 50a', 50a", 50a"' extend to an edge of the transparent element 50, the adhesive material 24 (FIG. 7) could exit the trenches from the edge of the transparent element in the case that the trenches 50a, 50a', 50a", 50a"' are full, thereby preventing any adhesive material 24 (FIG. 8) from moving onto the array of pixels 16 (FIG. 8). The illustrated transparent element 50 could be included in the FIG. 2 die package 200.

Figure 11:
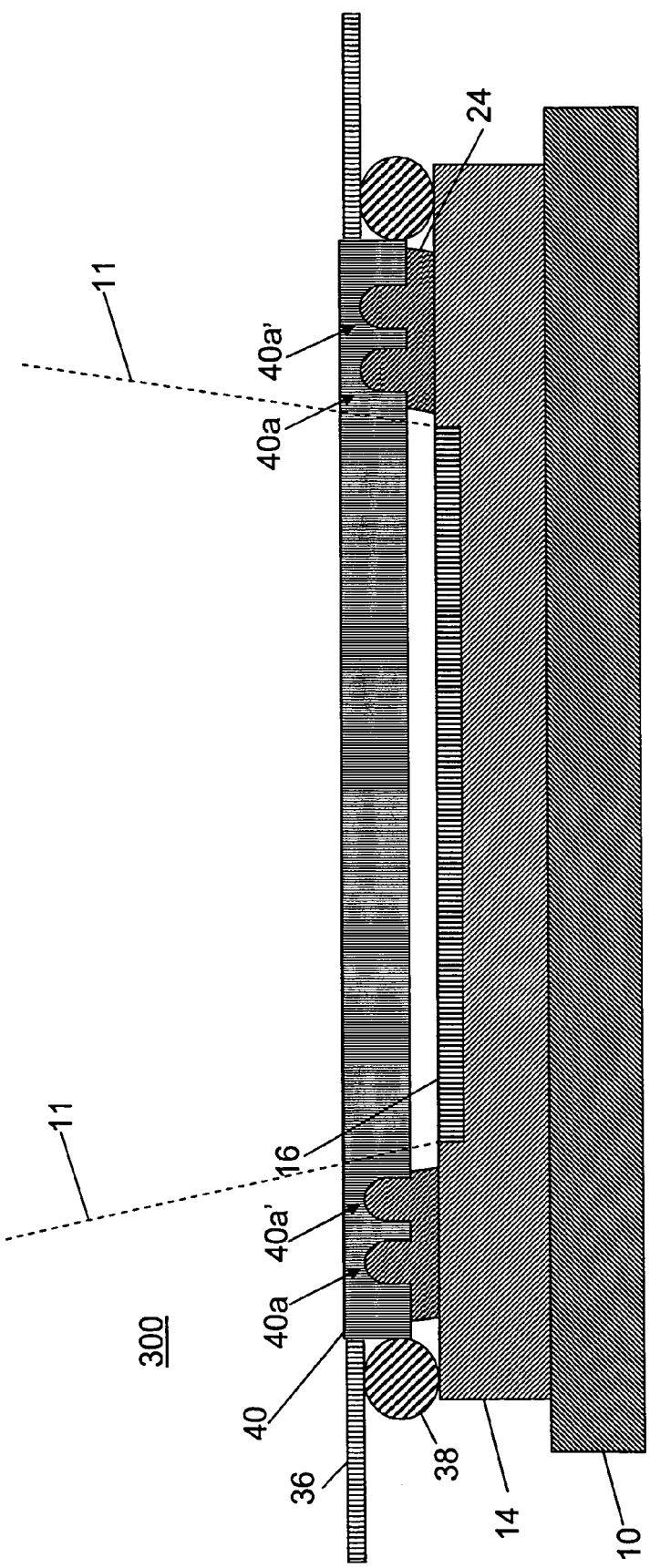
FIG. 11 illustrates a cross-sectional view of a die package constructed in accordance with a third exemplary embodiment of the invention.

FIG. 11 illustrates a die package 300 constructed in accordance with a third embodiment of the invention. The illustrated die package 300 has a transparent element 40 having an adhesive flow restriction area comprising two trenches 40a, 40a' which prevent the adhesive material 24 from occluding the optical light path 11 to the array of pixels 16. Additionally, the illustrated die package 300 has a flip-chip design, in which conductive pads 38 electrically connect the die 14 to external circuitry (not shown) by conductive tape 36. Although the trenches 40, 40' are illustrated with a curved shape, this is not intended to be limiting, as any profile providing a space which can be filled with adhesive material 24 will work.

Figure 12:
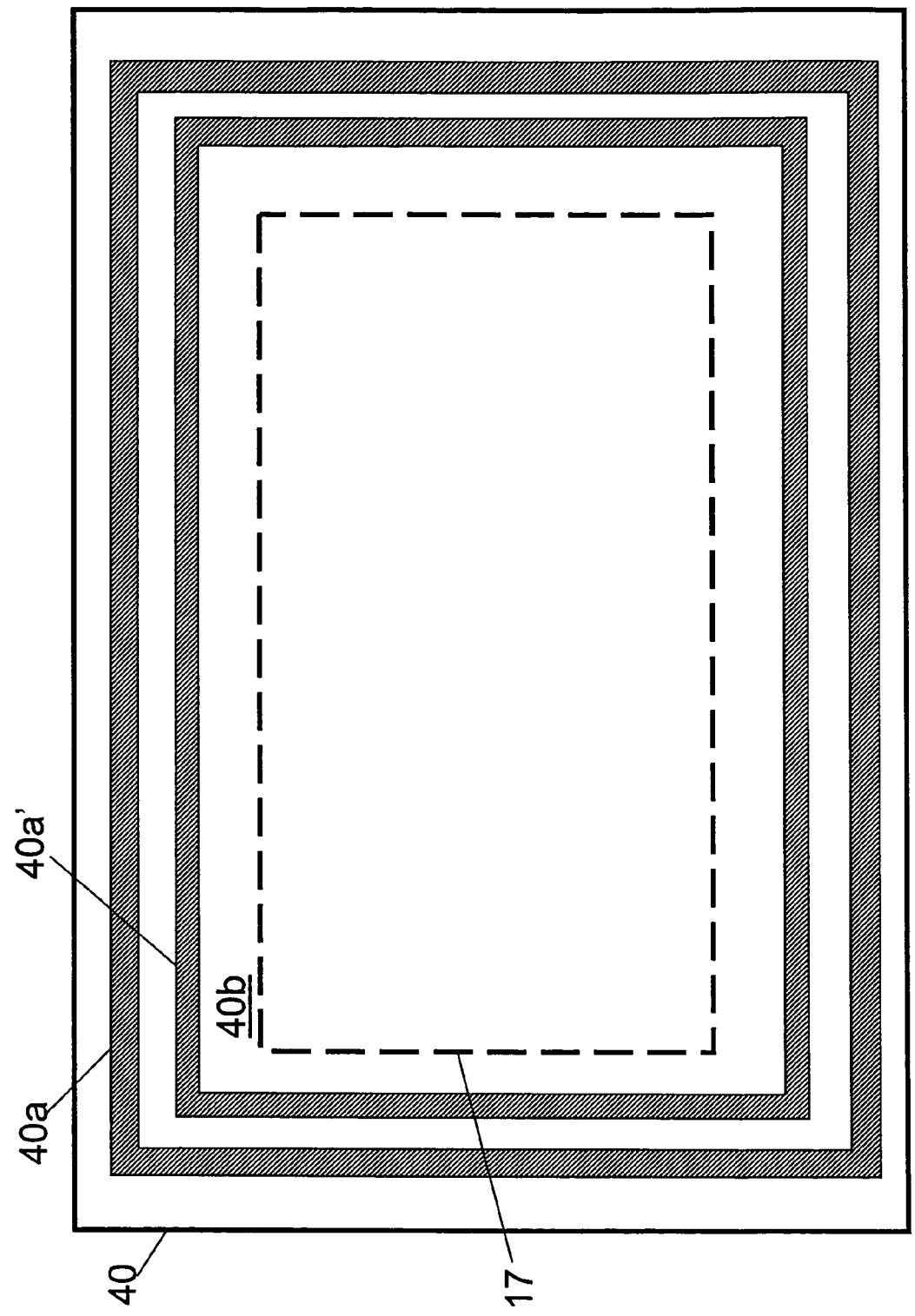
FIG. 12 illustrates a top-down view of a surface of the FIG. 11 transparent element constructed in accordance with a third exemplary embodiment of the invention.

FIG. 12 illustrates a top-down view of the FIG. 11 transparent element 40 constructed in accordance with the third embodiment of the invention. The illustrated transparent element 40 has an adhesive flow restriction area comprising two trenches 40a, 40a' that define a predefined area 40b. The predefined area 40b corresponds to the array area 17 (illustrated as dotted lines) on the die 14 (FIG. 11). The trenches 40a, 40a' fill with adhesive material 24 (e.g., FIGS. 7 and 8) during processing, as discussed above with respect to FIGS. 4-9. Thus, any adhesive material 24 which makes it past the outer peripheral trench 40a will be prevented from moving onto the array of pixels 16 by the inner trench 40a'.

Figure 13:
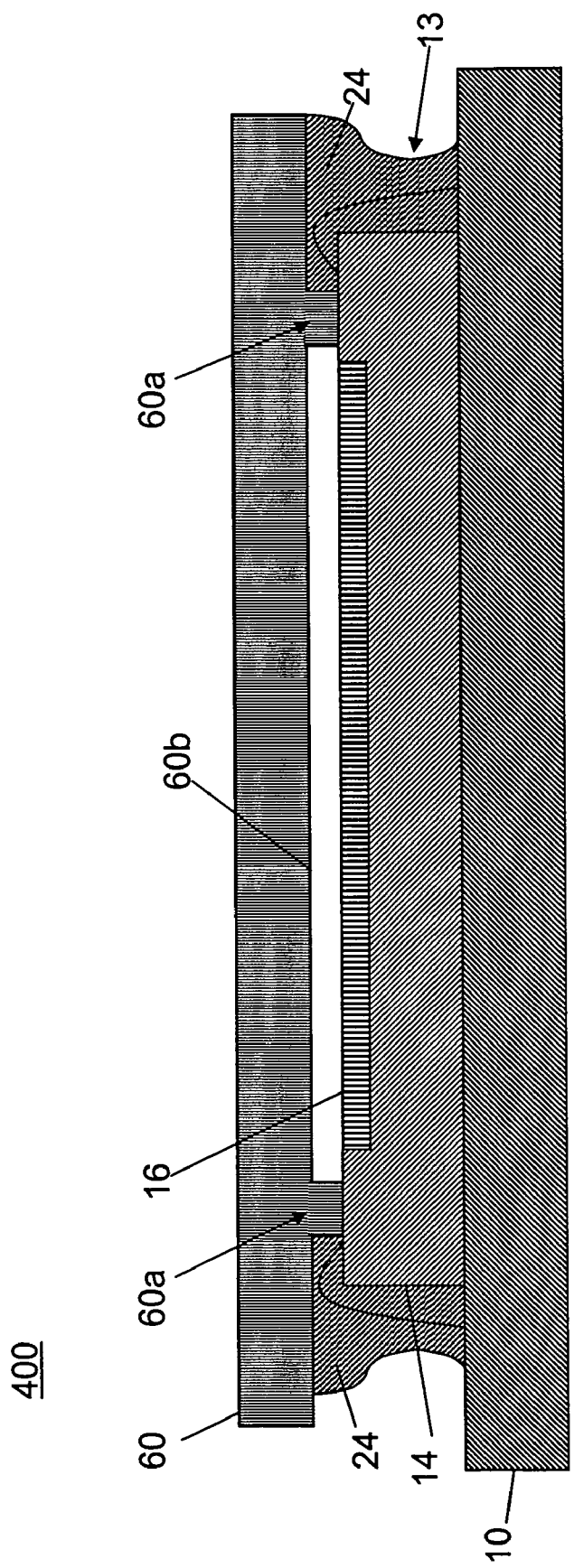
FIG. 13 illustrates a cross-sectional view of a die package constructed in accordance with a fourth exemplary embodiment of the invention.

FIG. 13 illustrates a die package 400 constructed in accordance with a fourth embodiment of the invention. The illustrated die package 400 has an adhesive flow restriction area 60a formed on a transparent element 60. The transparent element 60, in turn, is placed over and attached to the die 14. The illustrated adhesive flow restriction area comprises a protuberance in the form of a mesa 60a formed on a lower surface 60b of the transmitting element 60, which prevents adhesive material 24 from moving onto the pixels of the array of pixels 16. The protuberance 60a could have a flat surface, such as a mesa, a pointed surface, or a rounded surface. Additionally, the FIG. 13 die package 400 has an adhesive material 24 that completely encapsulates the wire bonds 13, for applications in which the complete protection of the wire bonds 13 is desired. The illustrated adhesive flow restriction area protuberance 60a could create a periphery around the periphery of the die 14, or the protuberance 60a could be formed only on locations on the transparent element 60 where the adhesive material 24 is used to attach the transparent element 60 to the die 14.

Figure 14:
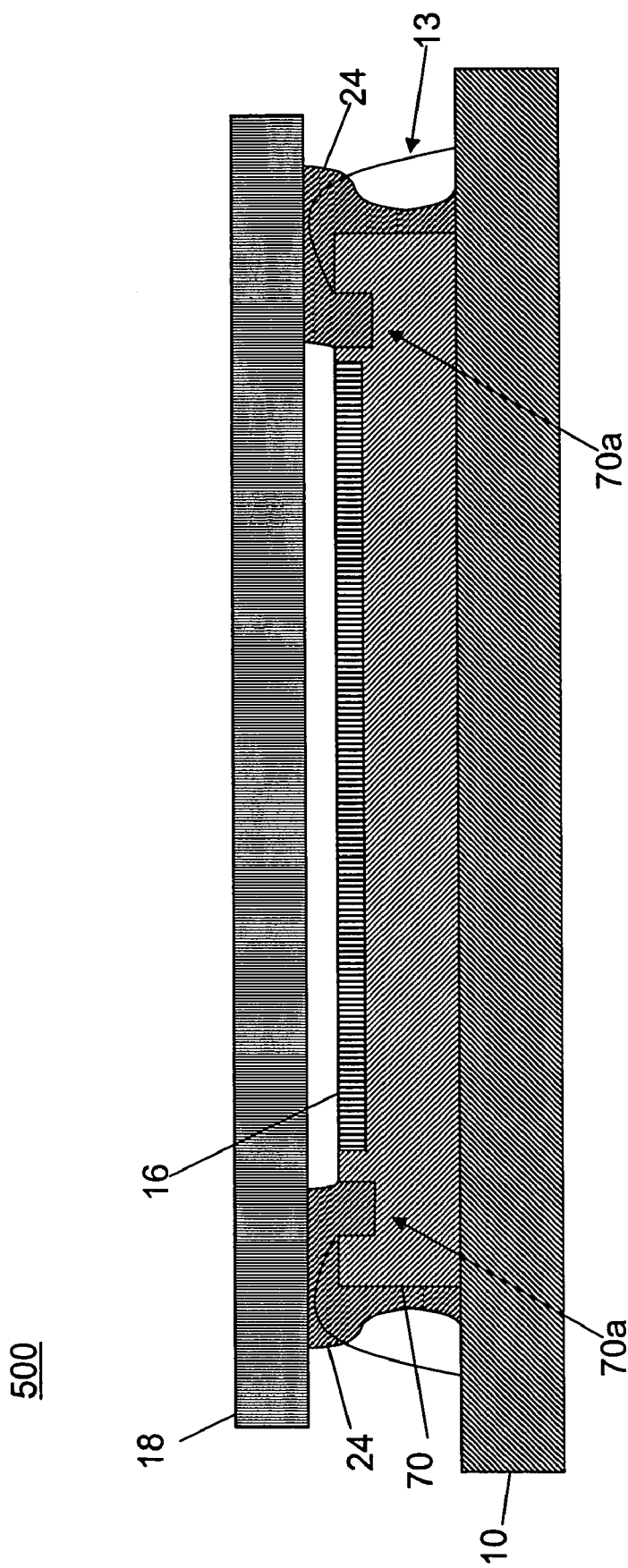
FIG. 14 a cross-sectional view of a die package constructed in accordance with a fifth exemplary embodiment of the invention.

FIG. 14 illustrates a die package 500 constructed in accordance with a fifth embodiment of the invention. The illustrated die package 500 has an adhesive flow restriction area 70a formed within a modified die 70. The adhesive flow restriction area comprises a trench on a surface of the modified die 70 having the array of pixels 16. The adhesive flow restriction area 70a breaks any wicking force, thereby preventing any adhesive material 24 from moving onto the pixels of the array of pixels 16. The adhesive flow restriction area trench 70a could completely surround a periphery of the array of pixels 16, or could simply be provided only where the adhesive material 24 is used to attach the transparent element 18 to the die 70.

Figure 15:
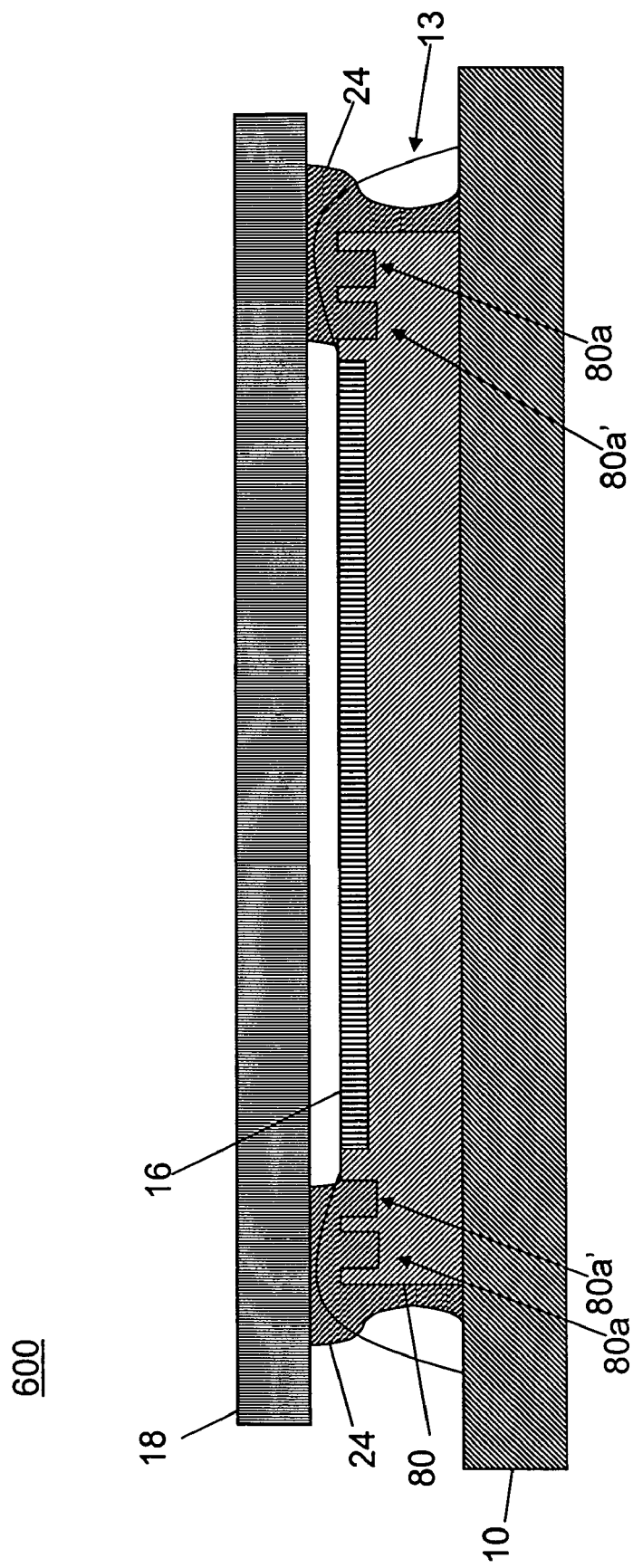
FIG. 15 illustrates a cross-sectional view of a die package constructed in accordance with a sixth exemplary embodiment of the invention.

FIG. 15 illustrates a die package 600 constructed in accordance with a sixth embodiment of the invention. The illustrated die package 600 has an adhesive flow restriction area comprising a plurality of trenches 80a, 80a' formed on a surface of a modified die 80 having an array of pixels 16. The plurality of trenches 80a, 80a' that break the capillary action that might otherwise result in the adhesive material 24 moving onto the pixels of the array of pixels 16. Thus, any adhesive material 24 which makes it past an outer peripheral trench 80a will be prevented from moving onto the array of pixels 16 by an inner peripheral trench 80a'. The trenches 80a, 80a' could be formed to extend to an edge of the die 80, so that if the trenches 80a, 80a' fill with adhesive material 24, any excess adhesive material 24 could exit from an edge of the die 80.

Figure 16:
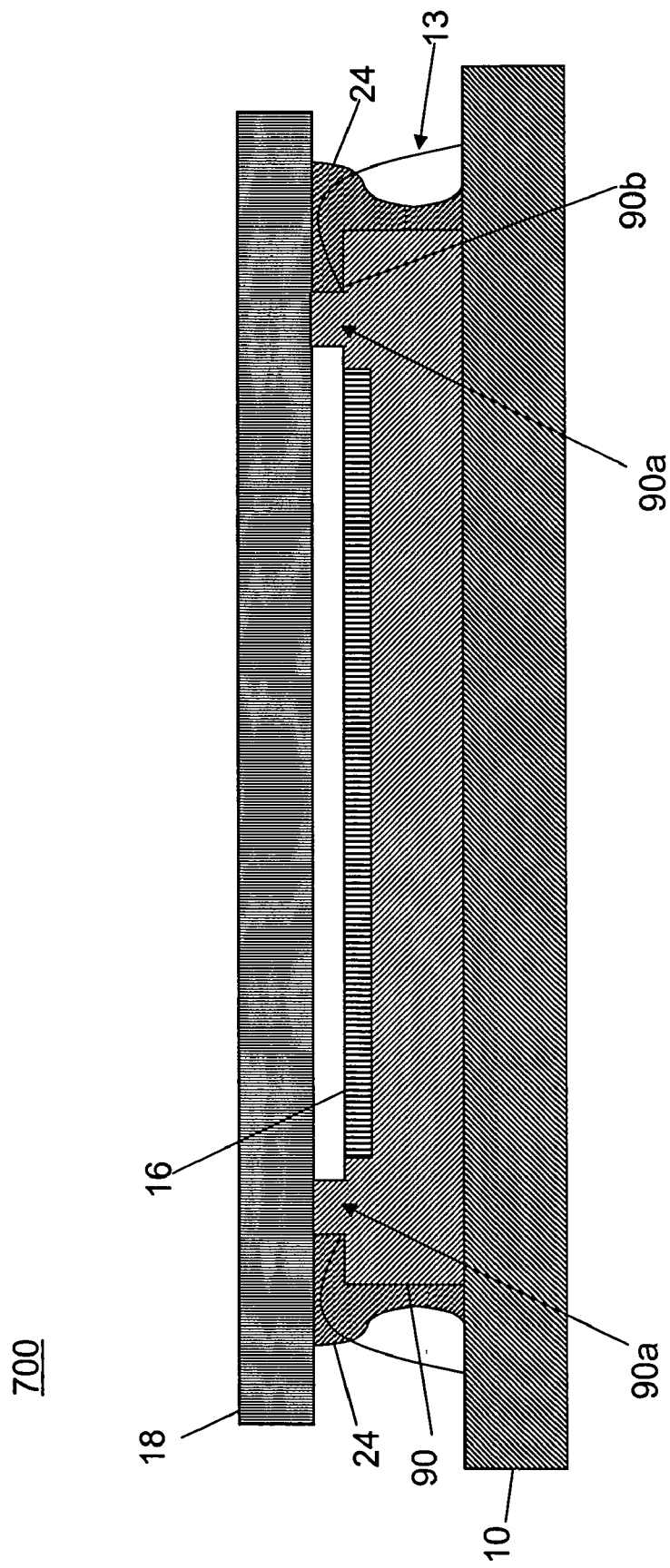
FIG. 16 illustrates a cross-sectional view of a die package constructed in accordance with a seventh exemplary embodiment of the invention.

FIG. 16 illustrates a die package 700 constructed in accordance with a seventh embodiment of the invention. The illustrated die package 700 has an adhesive flow restriction area comprising a protuberance in the form of a mesa 90a formed on a surface of a modified die 90 having an array of pixels 16. As the transparent element 18 is positioned over and attached to the modified die 90, the adhesive material 24 is prevented from moving onto the pixels of the array of pixels 16, due, in part, to the adhesive flow restriction area 90a. The illustrated adhesive flow restriction area protuberance 90a could create a periphery around the periphery of the array of pixels 16 on the die 90, or the protuberance 90a could be formed only on locations on the die 90 where the adhesive material 24 is used to attach the transparent element 18 to the die 90.

It should be noted that although the shapes of the trenches and protuberances comprising the adhesive flow restriction areas, e.g., 30a, 40a, 50a, 50a', 50a", 50a"', 60a, 70a, 80a, 80a', 90a, have been illustrated as rectangular or curved, the shapes of the adhesive flow restriction areas are inconsequential to the operation of the invention, and may constitute any shape such that adhesive material 24 (e.g., FIG. 16) is prevented from moving onto the array of pixels 16 (e.g., FIG. 16).

It should also be noted that the various embodiments of the invention may be used with dies (e.g., 14, 70, 80, 90) which have an array of pixels 16 which converts an applied image to electrical signals, or to dies (e.g., 14. 70, 80, 90) for image display, which have an array of pixels 16 for generating an image in response to applied signals.

In addition, although each of the embodiments has been illustrated and described as having one trench or protuberance or two trenches or protuberances, this is not intended to be limiting. For example, a die package could be formed having a transparent element having an adhesive flow restriction area comprising two or more trenches. Similarly, a modified die could be formed having an adhesive flow restriction area comprising two or more concentric protuberances. Additionally, each trench or protuberance could be formed to extend from an edge to an edge of either a transparent element or die.

The above description and drawings illustrate preferred embodiments which achieve the objects, features, and advantages of the present invention. Although certain advantages and preferred embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

What is claimed as new desired to be protected by Letters Patent of the United States is:

1. An imaging device, comprising:
   a die having a first surface containing an array of imaging elements; and
   a transparent element adhesively attached to the die by an adhesive material, the first surface of the die having at least one adhesive flow restriction area for impeding flow of an adhesive across the first surface of the die, wherein the adhesive flow restriction area comprises at least one trench extending below the first surface of the die.

2. The imaging device of claim 1, wherein the at least one trench has a curved shape.

3. The imaging device of claim 1, wherein the at least one trench creates a perimeter around the array of imaging elements.

4. The imaging device of claim 3, further comprising a second trench creating a perimeter around the at least one trench.

5. The imaging device of claim 1, wherein the at least one trench extends from edge to edge of the die.

6. The imaging device of claim 1, wherein the transparent element is comprised of a material selected from the group consisting of glass, an optical thermoplastic material, a polyimide, a thermoset resin, a photosensitive gelatin, and a radiation curable resin.

7. The imaging device of claim 1, wherein the adhesive material at an edge of the transparent element completely covers wire bonds electrically connecting the die to conductive lines.

8. The imaging device of claim 1, wherein the die is associated with a substrate.

9. The imaging device of claim 1, wherein the die is electrically connected to conductive tape by at least one conductive structure.

10. The imaging device of claim 9, wherein the at least one conductive structure is a solder ball.

11. The imaging device of claim 1, wherein the imaging element is comprised of an array of pixels, the pixels providing electrical signals corresponding to a response from light radiation.

12. The imaging device of claim 1, wherein the imaging element is comprised of an array of pixels, the pixels capable of displaying an image corresponding to electrical signals.

13. The imaging device of claim 1, wherein a vacant space between the transparent element and the array of imaging elements is hermetically sealed by the adhesive material.

14. The imaging device of claim 4, wherein the second trench extends below the first surface of the die.

* * * * *